United States Patent
Hsu et al.

(10) Patent No.: US 6,271,068 B1
(45) Date of Patent: Aug. 7, 2001

(54) METHOD FOR MAKING IMPROVED POLYSILICON EMITTERS FOR BIPOLAR TRANSISTORS ON BICMOS INTEGRATED CIRCUITS

(75) Inventors: Yung-Lung Hsu, Tainan; Ruey-Hsin Liou, Hsin-Chu, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/755,279

(22) Filed: Jan. 8, 2001

(51) Int. Cl.$^7$ .................. H01L 21/8238; H01L 21/8299; H01L 21/331

(52) U.S. Cl. .................. 438/203; 438/205; 438/239; 438/361; 438/366; 438/564

(58) Field of Search .................. 438/342, 361, 438/366, 368, 359, 203, 204, 205, 234, 564; 257/578, 579, 587, 592

(56) References Cited

U.S. PATENT DOCUMENTS

| | | | |
|---|---|---|---|
| 4,214,256 | * 7/1980 | Daial et al. | 357/71 |
| 4,215,156 | * 7/1980 | Daial et al. | 427/84 |
| 4,318,751 | * 3/1982 | Horng | 357/59 |
| 4,452,645 | * 6/1984 | Chu et al. | 357/59 |
| 4,936,928 | * 6/1990 | Shaw et al. | 437/31 |
| 5,028,557 | 7/1991 | Tsai et al. | 437/59 |
| 5,144,403 | * 9/1992 | Chaing et al. | 357/49 |
| 5,171,702 | * 12/1992 | Prengle | 437/59 |
| 5,342,794 | * 8/1994 | Wei | 437/41 |
| 5,466,615 | 11/1995 | Tsai | 437/31 |
| 5,773,340 | 6/1998 | Kumauchi et al. | 438/224 |
| 5,846,869 | * 12/1998 | Hashimoto et al. | 438/365 |
| 5,874,333 | 2/1999 | Chang et al. | 438/250 |
| 5,953,600 | 9/1999 | Gris | 438/200 |
| 6,004,855 | 12/1999 | Pollock et al. | 438/342 |
| 6,180,478 | * 1/2001 | Lee et al. | 438/309 |

* cited by examiner

Primary Examiner—Michael Lebentritt
(74) Attorney, Agent, or Firm—George O. Saile; Stephen B. Ackerman

(57) ABSTRACT

A method for making an improved polysilicon emitter for a bipolar transistor in a BiCMOS integrated circuit is achieved. The method uses a novel stacked undoped amorphous silicon layer and a doped polysilicon layer. The polysilicon layer is doped by ion implantation while the amorphous silicon layer remains undoped. The stacked layer is patterned to form a polysilicon emitter source over the bipolar transistor, while concurrently forming gate electrodes for the FETs. The undoped amorphous silicon layer retards the diffusion from the doped polysilicon to provide a shallower emitter junction during subsequent thermal processing. At a later step a rapid thermal anneal (RTA) is carried out in which the amorphous silicon layer provides better control of the diffused emitter depth (junction) while concurrently activating the implant dopant in the FET source/drain areas. The better control of the shallow emitter depth over the conventional doped polysilicon emitter results in a smaller standard deviation of the current gain. Also the collector-to-emitter breakdown voltage is increased, and the reduced junction capacitance increases the cutoff frequency.

17 Claims, 5 Drawing Sheets

FIG. 3A –
Prior Art

METHOD FOR MAKING IMPROVED POLYSILICON EMITTERS FOR BIPOLAR TRANSISTORS ON BICMOS INTEGRATED CIRCUITS

BACKGROUND OF THE INVENTION

(1) Field of the Invention

This invention relates to integrated circuit semiconductor devices, and more particularly to a method for making bipolar transistors having improved emitters in bipolar/CMOS devices. This novel method results in bipolar transistors having emitters with shallower junction depths and better process control of the junction depth. These shallower junction depths are useful for submicrometer high-speed BiCMOS circuits in which the bipolar transistor performance is improved, for example, by increasing the breakdown (punchthrough) voltage, increasing the cutoff frequency, while maintaining a reasonable current gain.

(2) Description of the Prior Art

BiCMOS circuits are formed by integrating bipolar transistors and complementary metal on silicon (CMOS) field effect transistor (FET) devices on the same silicon chip. The CMOS devices provide low power and high density for digital applications, while bipolar transistors (current switch) require high power consumption and provide higher off-chip drive currents and lower logic swings. Many of the application-specific integrated circuits (ASIC) take advantage of these opposing properties by integrating the bipolar transistors and FET devices on the same silicon chip.

However, one problem on integrating the two devices on the same chip is optimizing the electrical characteristics of one device without adversely affecting the electrical characteristics of the other device. In one approach, to save process steps it is desirable to form the FET gate electrodes and concurrently to form the doped polysilicon emitter for the bipolar transistor. It is necessary to use a rapid thermal anneal (RTA) to activate the dopant implant for the FET source/drain contacts for low contact resistance after forming the FET gate electrodes and the bipolar emitter. However, this RTA makes it difficult to control the shallow diffused emitter junction depth to achieve a high-performance bipolar transistor.

Several methods for making bipolar transistors in BiCMOS circuits are described in the literature. For example, in U.S. Pat. No. 5,773,340 to Kumauchi et al., a phosphorus-doped amorphous silicon layer is deposited and annealed to convert the amorphous silicon into a polysilicon for doping the bipolar emitter. The phosphorus present in the amorphous silicon is diffused into the bipolar active base region, followed by a high-temperature/short-time annealing to activate the impurity dopants for the source/drain regions of the MOS-FETs. In the invention U.S. Pat. No. 5,874,333 to Chang et al. a method is described for forming a doped polysilicon layer having a less rough upper layer. This is achieved by depositing the polysilicon layer at a high temperature (about 630° C.) and, without interrupting the deposition process, the temperature is ramped down to 560° C. to provide a smooth surface having minimal grain growth. In U.S. Pat. No. 5,953,600 to Gris the FETs are formed prior to forming the bipolar transistor. This allows the source/drain contacts to be activated by RTA prior to forming the shallow emitters for the bipolar transistor. However, this process requires additional process steps. In U.S. Pat. No. 5,028,557 to Tsai et al. a reverse self-aligned BICMOS circuit is described in which polysilicon source/drain contacts for the FETs are formed by out-diffusion and the extrinsic base for the bipolar transistor are made prior to forming the polysilicon emitter self-aligned to the extrinsic base (polysilicon) contacts. In U.S. Pat. No. 5,466,615 to Tsai a protective block layer is formed over the substrate where the FET gate electrode and bipolar transistor emitter areas are to be formed. This patent also uses a reversed self-aligned process to form the BiCMOS circuit. In U.S. Pat. No. 6,004,855 to Pollock et al. a high-performance bipolar transistor structure is described in which an inter-digitated collector is made self-aligned to the emitter over the active base area. The invention does not address the integration of this bipolar transistor with CMOS devices.

However, there is still a need in the industry to provide a process for making BiCMOS circuits having bipolar transistors with shallower diffused junctions while being able to accurately control the emitter junction depth (fine tune) without adversely affecting electrical characteristics of the other devices on the chip. It is also important to achieve this goal while maintaining a cost-effective manufacturing process for making the BiCMOS circuits.

SUMMARY OF THE INVENTION

A principal object of the present invention is to make improved bipolar transistors with shallow emitter junctions for submicron high-speed BiCMOS circuits.

A second objective of this invention is to utilize a stacked amorphous silicon/polysilicon layer in the emitter structure, which allows shallower emitter junction depths to be achieved while using a rapid thermal anneal process. This allows the shallow emitter junction depths to be fine tuned for the specific circuit application while achieving low contact resistance source/drain contacts for the FETs.

A third objective of this invention is to provide a process that is easy to integrate into the current BiCMOS process without significantly increasing process complexity.

This novel invention is a method for making a BiCMOS circuit, and more specifically for making a stacked amorphous silicon/polysilicon emitter with more controllable shallow diffused junction depths for the bipolar transistor. Further, by adjusting the rapid thermal anneal (RTA) parameters at a later process step, the emitter junction depth can be varied to optimize bipolar electrical characteristics while activating the implanted dopant in the source/drain areas for the BiCMOS circuit.

The process sequence for making the BiCMOS starts by providing a $P^-$ single-crystal silicon substrate in which $N^+$ and $P^+$ buried layers are formed. An $N^-$ epitaxial layer is grown on the substrate. Next P wells and N wells are implanted respectively in the $N^-$ epitaxial layer over some portions the $N^+$ buried layers and the $P^+$ buried layers in which the N channel and P channel FETs for the CMOS portion of the BiCMOS circuit are formed. Next, a field oxide is formed to surround and electrically isolate the N channel and P channel device areas, and to provide isolation around the bipolar transistor device areas over portions of the $N^+$ buried layer. The bipolar transistors are fabricated in the $N^-$ epitaxial layer over these portions of the $N^+$ buried layers. First, a reachthrough or sinker implant is carried out to form contacts to the $N^+$ buried layers which serves as the subcollector of the bipolar transistors. A polysilicon layer, having a cap insulating layer, is deposited and patterned to form polysilicon resistors and capacitors, and a gate oxide and the first part of a split polysilicon deposition is carried out to protect the gate oxide. The base regions are implanted in the $N^-$ epitaxial layer over the subcollectors and in proximity to the sinker implant. Emitter openings are etched to the base regions. Next, and a key feature of this invention is to form a stacked undoped amorphous silicon/polysilicon layer in a single deposition step. The polysilicon upper portion of the stacked layer is then implanted without implanting the underlying undoped amorphous silicon layer. The stacked layer is patterned to form polysilicon emitters for the bipolar transistor while concurrently forming FET gate electrodes. Then the lightly doped drains (LDDs), sidewall spacers, and source/drain contacts for the FETs are formed. An interlevel dielectric (ILD) layer is deposited and leveled by annealing, while the undoped amorphous silicon layer prevents the diffusion of the emitter from the doped polysilicon emitter into the intrinsic base region on and in the substrate. Next, contact openings are etched in the ILD layer to the contact areas on the substrate. Another key feature of this invention is to carry out a rapid thermal process (RTP) drive-in to form the shallow diffused emitter junction and to concurrently electrically activate the dopant implants, such as the LDDs and source/drain implants for the FETs. The RTP drive-in temperature and time can be adjusted (fine tuned) to reduce the emitter diffusion junction depth and to increase the base width. This novel stacked polysilicon emitter and RTP improve the device electrical characteristics such as increasing the collector-to-emitter breakdown voltage ($BV_{ceo}$), current gain, and cutoff frequency. The BiCMOS is then completed by using conventional processing to form the multilevel of metal interconnections and passivation.

BRIEF DESCRIPTION OF THE DRAWINGS

The objects and advantages of this invention are best understood with reference to the attached drawings in the figures and the embodiment that follows.

FIG. 3A shows schematically an SEM cross-section of a bipolar transistor fabricated by the conventional method.

DESCRIPTION OF THE PREFERRED EMBODIMENT

This novel invention is a method for making a BiCMOS circuit, and more specifically for making a stacked amorphous/polysilicon emitter which allows one to make shallower diffusion junctions for the bipolar transistor in a BiCMOS process. By adjusting the rapid thermal anneal (RTA) parameters at a later process step, the emitter junction depth can be varied (fine tuned) to optimize the BiCMOS circuit characteristics.

Figure 1A:
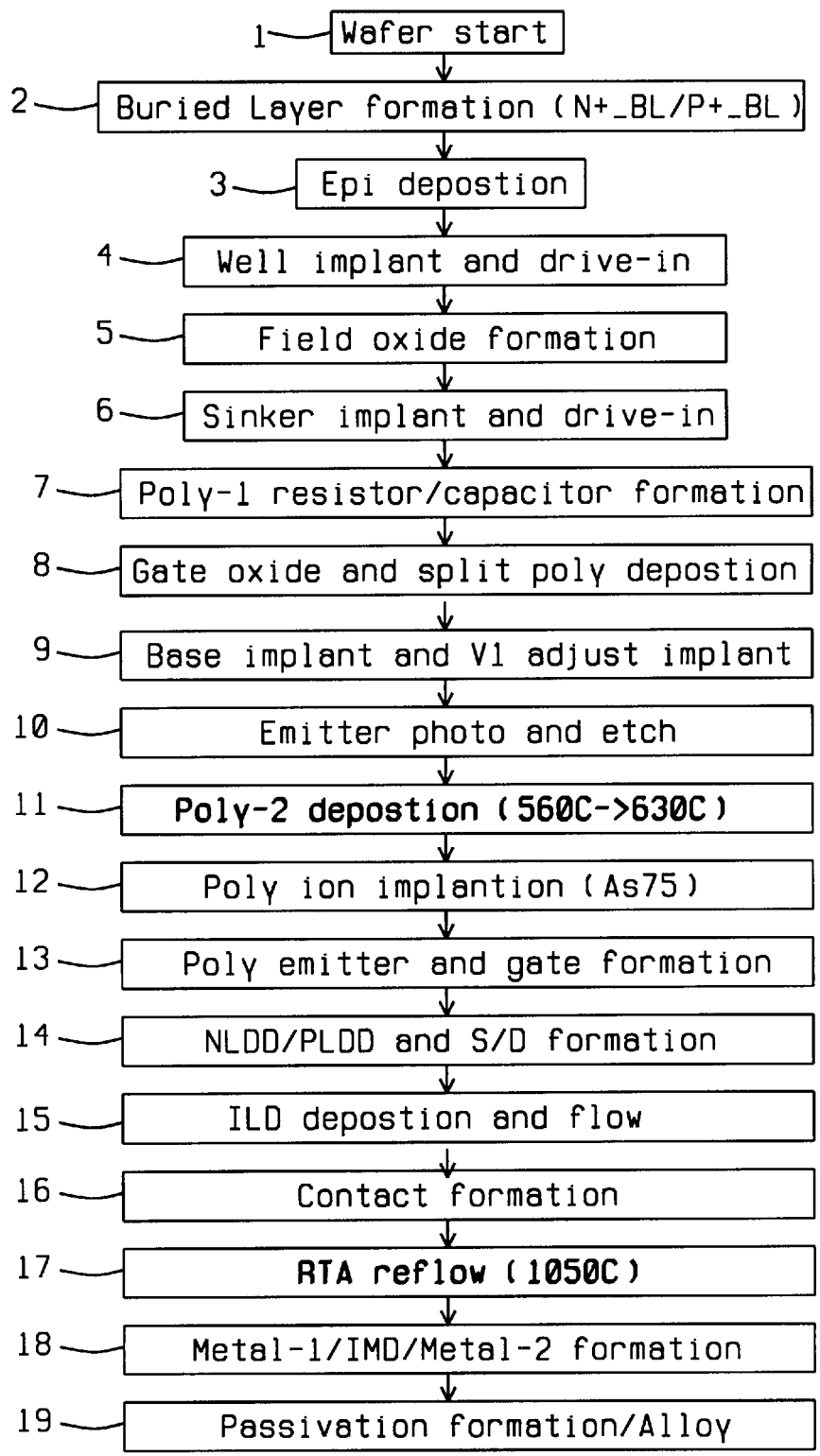
FIG. 1A shows an overall process flowchart for the sequence of process steps for making a bipolar CMOS circuit with this novel stacked amorphous silicon/polysilicon emitter and RTA emitter drive-in process.
Figure 1B:
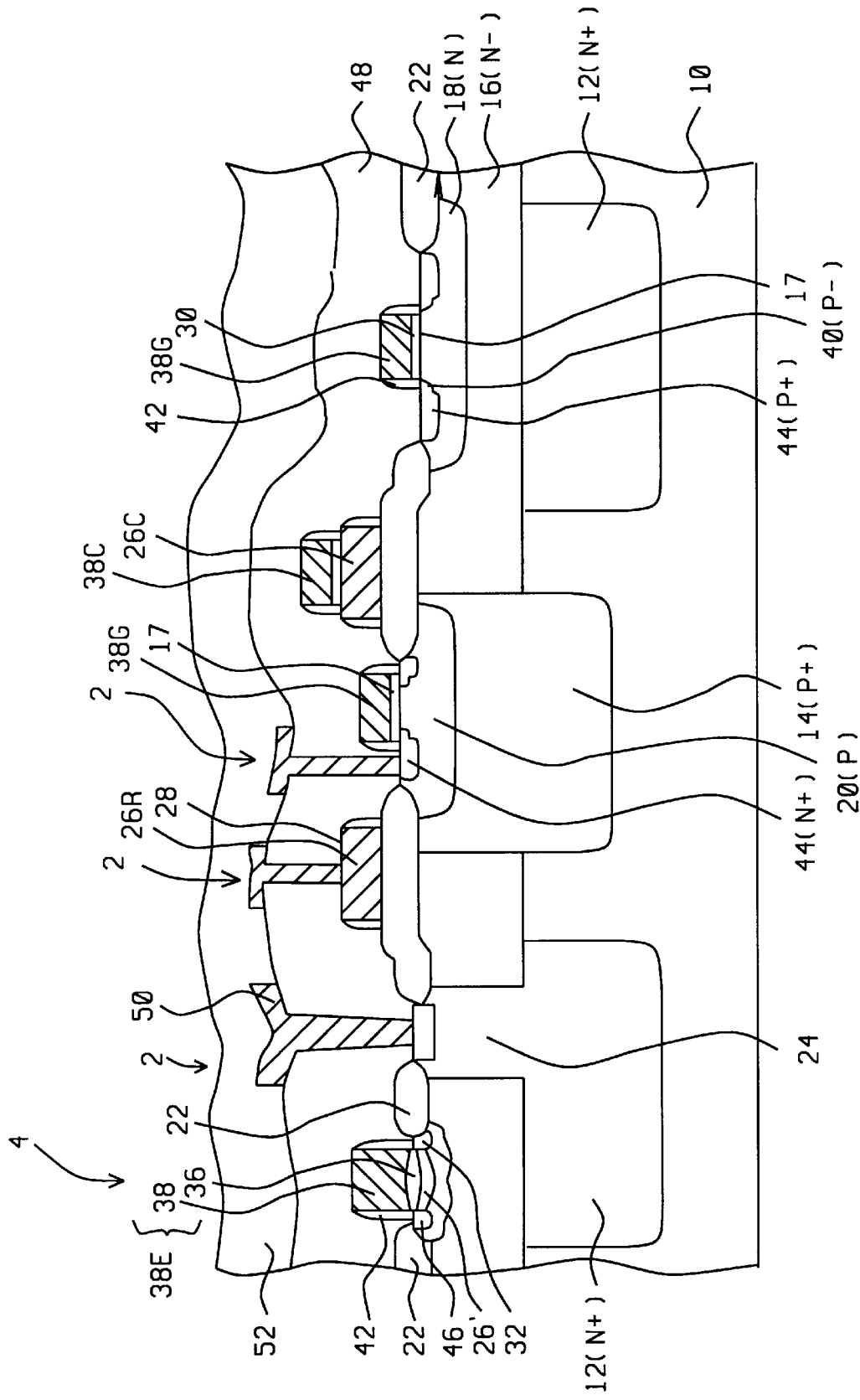
FIG. 1B shows a cross section of a BiCMOS structure completed up to the improved bipolar emitter.

The process sequence for making the BiCMOS is not described in detail to simplify the discussion, but the general sequence of process steps is shown in steps 1–19 in the flow diagram of FIG. 1A. FIG. 1B is a schematic crosssectional view of a portion of a BiCMOS device, and depicts the key elements in the sequence of process steps for better understanding the flow diagram of FIG. 1A. The process sequence for the BiCMOS circuit is briefly described to show how this novel bipolar transistor is integrated into a BiCMOS circuit, while the details for making the novel stacked emitter as indicated in step 11 of the flow diagram (FIG. 1A) and are described below in greater detail with respect to FIGS. 2–6.

Referring to step 1 of the flow diagram in FIG. 1A and to the cross section in FIG. 1B, the BiCMOS process starts by providing a P single-crystal silicon substrate 10 having a <100> orientation. As indicated by step 2, an N$^+$ buried layer 12 and a P$^+$ buried layer 14 are formed in the substrate 10 by using implant masks and implanting $Sb^{122}$ for the N$^+$ buried regions 12, and implanting $boron^{11}$ for the P$^+$ buried regions 14. In step 3 an N$^-$ epitaxial silicon layer 16 is grown on the substrate 10. In step 4 N wells 18 and P wells 20 are implanted in the N$^-$ epitaxial layer 16 over portions the N$^+$ buried layer 12 and the P$^+$ buried layer 14, respectively, for forming the N channel and P channel FETs (also referred to as NMOS and PMOS FETs) for the CMOS portion of the BiCMOS circuit. Portions of the N$^-$ epitaxial surface 16' without well implants are reserved for the bipolar transistors. In step 5 of FIG. 1A, a field oxide 22 is formed to surround and electrically isolate the N channel and P channel device areas, and to provide isolation for the bipolar transistor device areas (N$^-$ epitaxy regions 16') over the N$^+$ buried layer 12. The N$^+$ buried layer 12 later serves as the subcollector for the npn bipolar transistor. The field oxide 22 in FIG. 1B is formed using conventional techniques, such as the LOCal Oxidation of Silicon (LOCOS) method or Shallow Trench Isolation (STI), as commonly practiced in the industry.

Continuing with step 6 of FIG. 1A and referring to the cross section in FIG. 1B, a subcollector reachthrough implant 24, also referred to as a sinker implant, is implanted and is driven in to provide low electrical resistance contact to the subcollector 12 for the bipolar transistor. Next, referring to step 7, a polysilicon layer 26, having a cap insulating layer 28, is deposited and patterned to form polysilicon resistors 26R and bottom electrodes 26C for capacitors over the field oxide regions 22. The capacitor bottom electrodes 26C are selectively doped using ion implantation and an implant block-out mask. In step 8 a gate oxide 17 is grown on the substrate for the FET devices, and the first part of a split polysilicon deposition (not shown) is-carried-out to protect the gate oxide 17. In step 9 a base region 32 is implanted in the N$^-$ epitaxial layer 16' over the subcollector 12(N$^+$) and in proximity to the sinker or reachthrough implant 24. The implant can also serve as a threshold-voltage ($V_t$)-adjust implant for the N-channel FETs.

Figure 2:
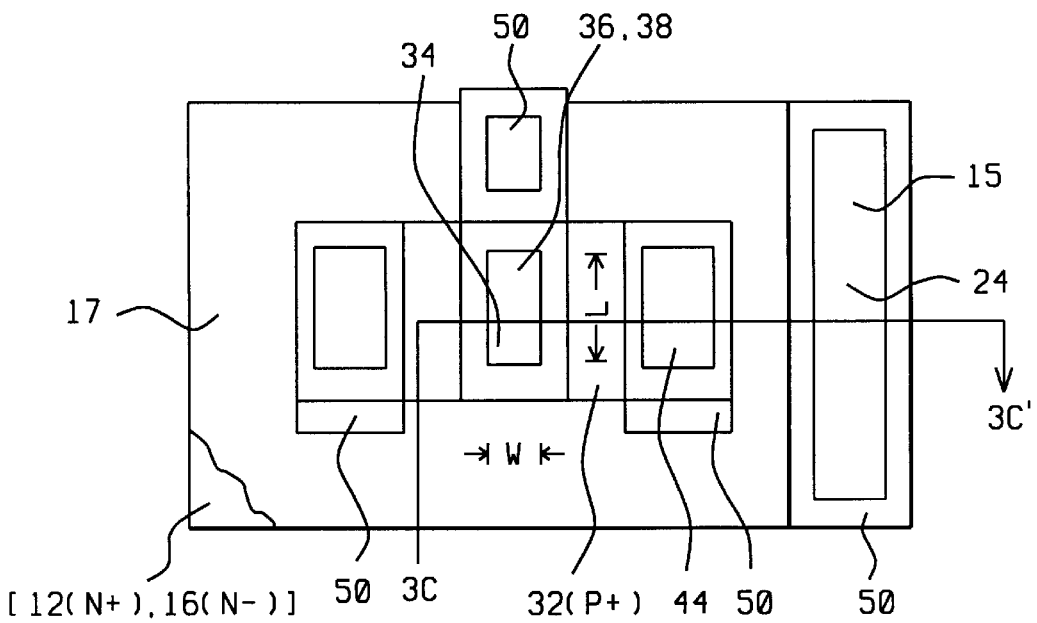
FIG. 2 shows a schematic top view of a bipolar transistor on a BiCMOS circuit indicating the stacked amorphous silicon/polysilicon emitter.
Figure 3B:
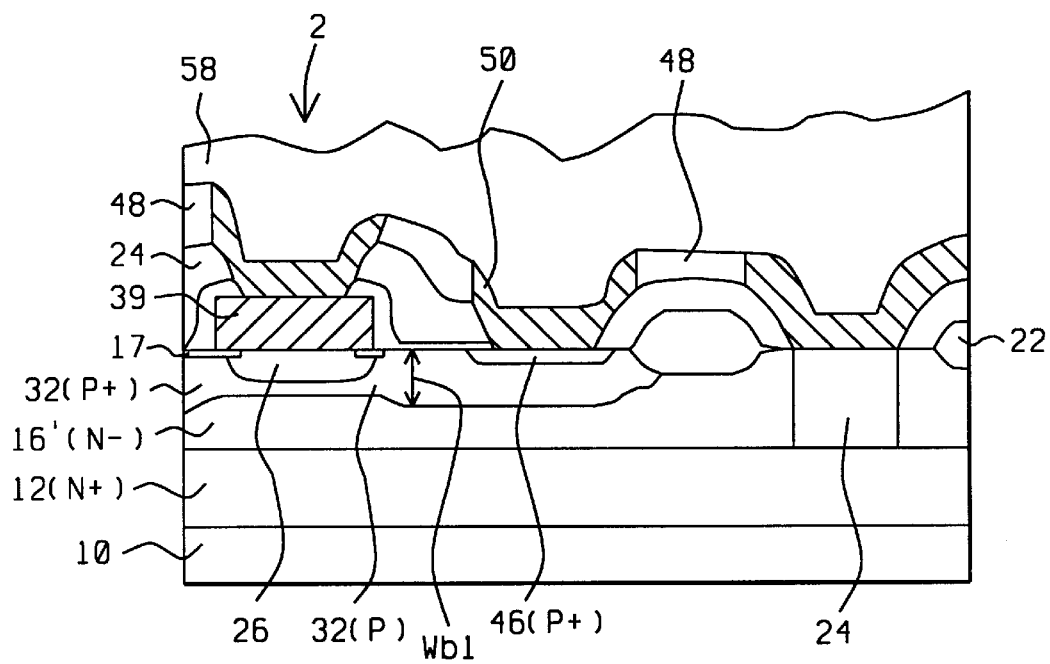
FIGS. 3B, 3C and 3D shows schematically an SEM cross-section of a bipolar transistor fabricated by the method of this invention having the shallower diffused emitter junction. The inserts labeled A and B depict enlarged views of the emitter, active base, and subcollector areas for the conventional bipolar transistor and the bipolar transistor by the method of this invention, respectively.
Figure 3B:
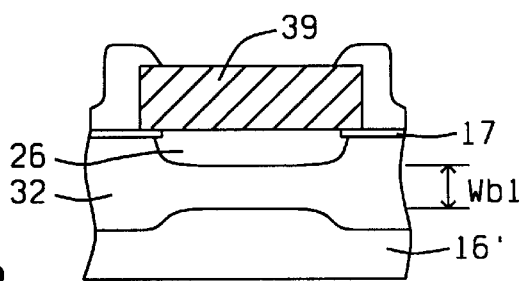
Figure 3C:
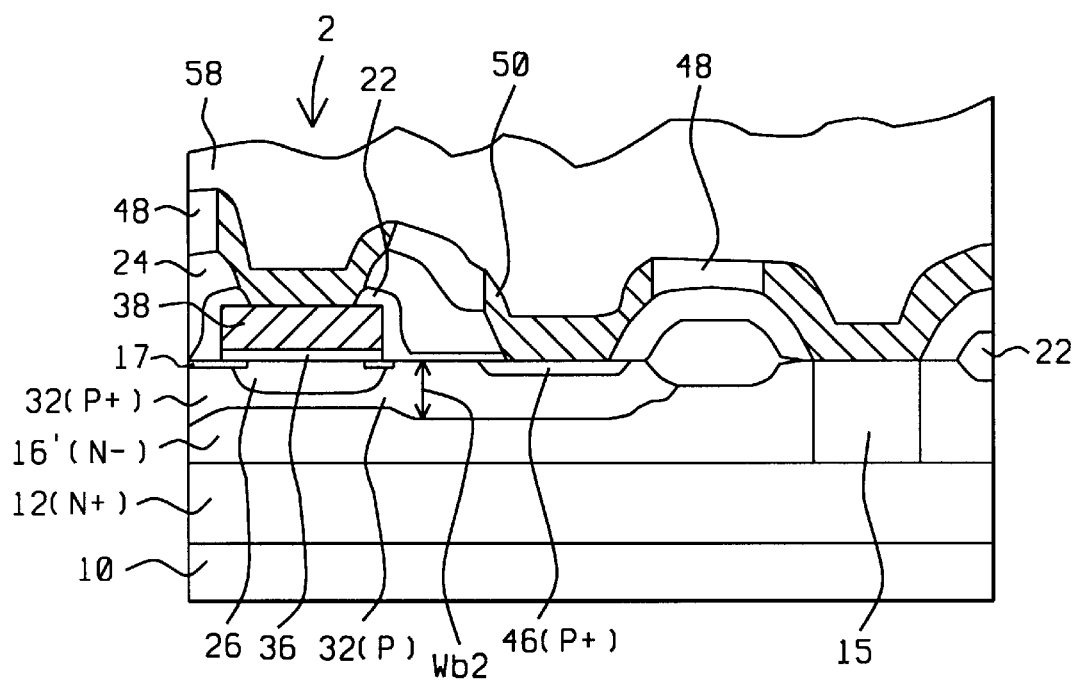
Figure 3D:
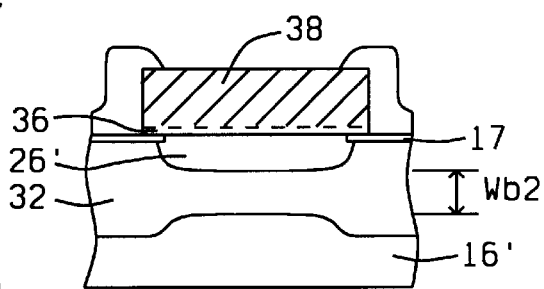

To better understand the novel feature of the bipolar transistor, an enlarged top view of the bipolar transistor 4 in FIG. 1B is depicted in FIG. 2, and a cross section through 3B–3B' is depicted in FIG. 3B. Also the bipolar device 4 in depicted for a more advanced device having (extrinsic) base contacts self-aligned to the emitter (FIG. 1B), while the bipolar transistor in FIGS. 2 and 3B is for a more standard designed (nonself-aligned) transistor. Although the transistors are different, the novel method of this invention applies equally to both transistor designs.

Referring to FIG. 2 and to step 10 of FIG. 1A, an emitter opening 34 is etched in the first part of the split polysilicon layer (not shown), and in the gate oxide layer 17 that is also formed over the base region 32. The emitter opening 34 is etched to the base region 32, as shown in the top view in FIG. 2. The bipolar transistor is fabricated in the N⁻ epitaxial layer 16' over the N⁺ buried region 12(N⁺) that serves as the subcollector, and has a sinker implant 24 as shown in FIG. 2.

To more clearly depict the invention, an enlarged cross-sectional view of the bipolar transistor is depicted in FIG. 3B, and compared to a bipolar transistor having a conventional emitter shown in FIG. 3A. The cross section shown in FIG. 3B is through the region 3B–3B' of the top view of the bipolar transistor in FIG. 2. The top view in FIG. 2 shows the subcollector 12N⁺ region with the over-lying epitaxial layer 16' (N⁻). Also shown is the base region 32 with the opening 34 in the gate oxide 17 and stacked amorphous silicon/polysilicon layer (36,38) which is patterned to form the emitter contact to the intrinsic base 32 in the opening 34.

Referring next to FIG. 3B and step 11 of FIG. 1A, a key feature of this invention is to form a stacked undoped amorphous silicon/polysilicon layer (36,38) in a single deposition step. The amorphous silicon 36 is deposited by low-pressure chemical vapor deposition (LPCVD), using a reactant gas such as silane ($SiH_4$), at an initial temperature of about 560° C. for a time of about 10 minutes. The deposition temperature is then ramped up to about 650° C. at a rate of about 5° C. per minute to deposit a polysilicon layer 38 without interrupting the deposition process. The deposition is continued at the higher temperature to complete the stacked amorphous silicon/polysilicon layer (36 and 38). The thickness of the amorphous silicon layer 36 is preferably between about 300 and 600 Angstroms, and the upper polysilicon layer 38 has a thickness of between about 2600 and 3400 Angstroms.

In step 12, the polysilicon upper portion 38 of the stacked layer is implanted with an N⁺ dopant, without implanting the underlying amorphous silicon layer 36. The implant dopant is preferably arsenic and is implanted at a dose of between about 8.0 E 15 and 1.4 E 16 atoms/cm² and at an implant energy of about 30 to 80 KeV. At a later process step when the doped polysilicon 38 is used as an emitter diffusion source, the amorphous silicon layer 36 retards the diffusion to form a shallower diffused emitter. In the conventional process, as depicted in FIG. 3A, a single doped polysilicon layer 39 is deposited for the emitter diffusion source. As will become apparent at a later process step, this conventional emitter results in deeper diffused emitters and narrower base widths, which are less desirable for high-performance BiCMOS circuits.

Continuing with the flow diagram in FIG. 1A, step 13, and the cross sections in FIGS. 1B and 3B, the stacked layer 36 and 38 is then patterned to form polysilicon emitters 38E for the bipolar transistor, as shown in FIG. 3B, while concurrently forming gate electrodes 38G for the P channel and N channel FETs, as shown in FIG. 1B. Concurrently layer 38 is also patterned to form the top electrodes 38C for the capacitors. The stacked layer 36 and 38 is patterned using a photoresist etch mask (not shown) and anisotropic plasma etching, such as high-density-plasma (HDP) etching, using a chlorine-based etchant gas. In step 14 using appropriate implant block-out masks, the lightly doped source/drain areas 40N⁻ are implanted for the N channel FETs and 40P⁻ for the P channel FETs. Next, a conformal insulating layer, such as a CVD silicon oxide ($SiO_x$), is deposited using tetraethosiloxane (TEOS) as the reactant gas, and is anisotropically etched back to form sidewall spacers 42 on the patterned stacked layer (38,36). Using appropriate implant block-out masks, the source/drain contacts 44N⁺ and 44P⁺ are implanted for the respective N channel and P channel FETs. The P⁺ source/drain contact implant is also used to dope the extrinsic base regions 46 for the bipolar transistor.

Continuing with FIG. 1A, in step 15 an interlevel dielectric (ILD) layer 48 is deposited. Layer 48 is preferably borophosphosilicate glass (BPSG) and is deposited to a preferred thickness of between about 4500 and 7500 Angstroms, using TEOS as the reactant gas and dopant gases such as phosphine ($PH_3$) and a boron dopant such as $B_2H_6$. The ILD layer 48 is then leveled by annealing at a temperature of about 900° C. for about 20 minutes. During the anneal the undoped amorphous silicon layer 36 retards the diffusion from the doped polysilicon layer 38 into the P doped base region 32 of the substrate 10. In step 16, conventional photolithographic techniques and anisotropic plasma etching are used to etch contact openings 2 in the ILD layer 48 to the desired contact areas on the substrate, as shown in FIG. 1B.

Figure 4:
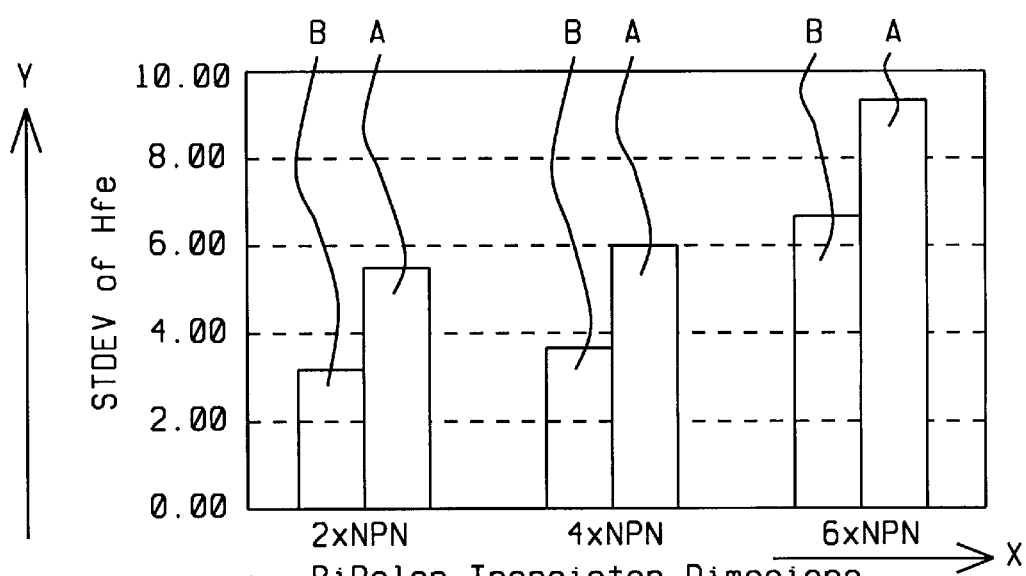
FIG. 4 is a bar chart of the standard deviation of the common emitter current gain ($I_c/I_b$) as a function of the bipolar transistor emitter size.
Figure 5:
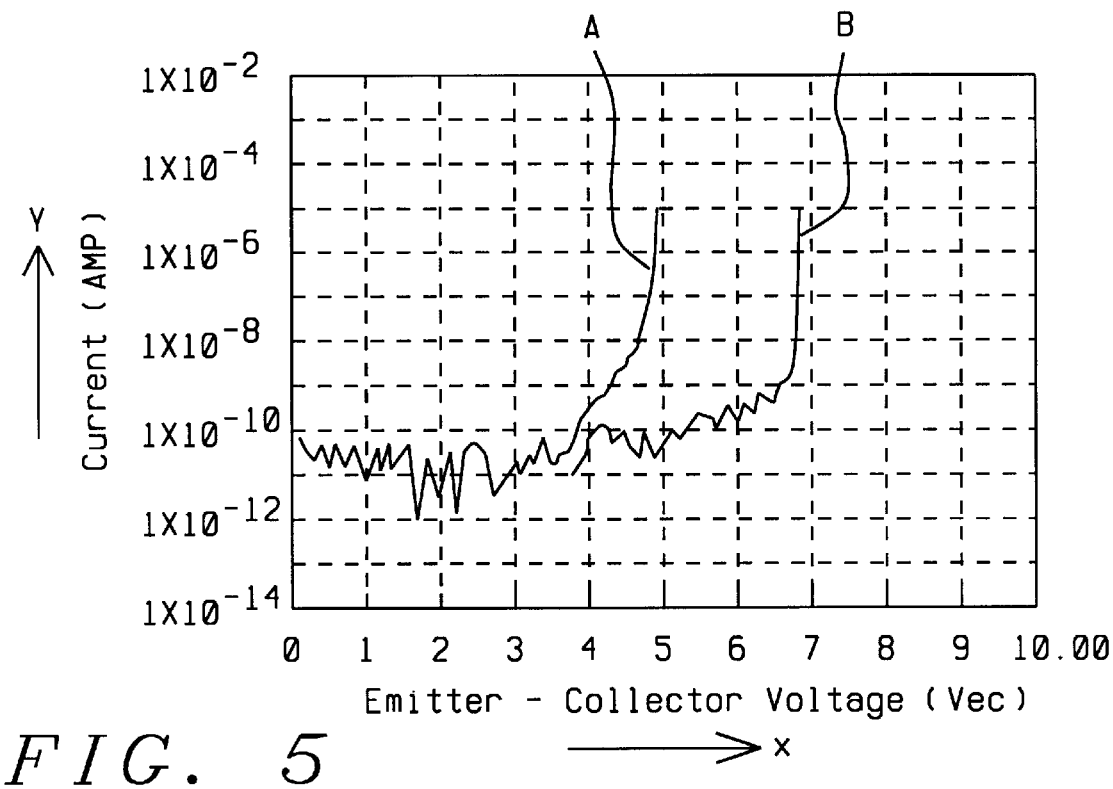
FIG. 5 shows a trace of collector current ($I_c$) on the y axis versus reverse bias collector-emitter voltage ($V_{ce}$) on the x axis for a conventional bipolar transistor and a transistor fabricated by the method of this invention. The voltage is ramped linearly to a value that exceeds the $BV_{ceo}$ at open base.

Another key feature of the invention (step 17 of FIG. 1A) is to perform a rapid thermal anneal (RTA) to drive in the shallow diffused emitter junction while concurrently electrically activating the dopant implants for the LDDs 40(N⁻) and 40(P⁺), and for the source/drain implants 44(N⁺) and 44(P⁺), as depicted in FIG. 1B. Referring to FIG. 3B and more specifically to the process for making the bipolar transistor, the RTA drive-in temperature and time are adjusted (fine tuned) to provide a bipolar diffused emitter 26' having a shallower diffused junction depth in the intrinsic base 18. For example, the RTA can be carried out at a temperature of between about 950 and 1100° C. and for a time of between about 10 and 60 seconds. To better appreciate the invention, the shallow emitter junction 26' and the intrinsic base region 18 are depicted in the enlarged cross-sectional view insert, labeled B, and is compared to a conventional diffused emitter 26 in the base region 18 in the enlarged cross-sectional view insert, labeled A, for a conventional bipolar transistor depicted in FIG. 3A. The advantage of this invention as depicted in the insert B is that the process uses an undoped amorphous silicon layer 36 to retard the diffusion of the emitter 26' from the doped polysilicon layer 38 to form a shallower diffused emitter 26'. In the conventional process (insert A), the emitter 26 is diffused directly into the base 18 from the polysilicon layer 39 and results in a deeper diffused emitter junction that is not as easy to control when activating the dopants in the source/drain areas. This conventional process results in a base width $W_{b1}$ which is narrower than the base width $W_{b2}$ for the novel process using the amorphous silicon layer 36, as shown in insert B. The shallower diffused emitter 26' and width $W_{b2}$ of the intrinsic base 18 result in improved electrical characteristics for the bipolar transistor. An advantage of this shallower emitter 26' and the wider base width $W_{b2}$ is a decrease in the standard deviation of the current gain $H_{fe}$ ($I_{collector}/I_{base}$), as shown in the bar graph of FIG. 4. In FIG. 4 the standard deviation in current gain is shown along the y axis as a function of emitter size (area) along the x axis. The emitter area 34 in the top view of FIG. 2 is represented by WxnL for increasing emitter sizes, where n is 2, 4, and 6, and the emitter size in FIG. 4 along the x axis is for emitters having 2x, 4x, and 6x increases in size. The standard deviation in the current gain for the conventional process is depicted by the vertical bars labeled A, and the standard deviation for the improved shallow junction emitters is shown by the vertical bars labeled B for the three different emitter sizes. As can be seen from FIG. 4. the method for making the bipolars with these improved shallow emitters results in smaller standard deviations. Another advantage of this invention is shown in the graph in FIG. 5, which represents the collector-to-emitter breakdown voltage ($BV_{ceo}$) as a function of the reverse-bias voltage between collector and emitter. The figure shows a semi-log plot of the collector current (y axis) versus the collector-to-emitter breakdown voltage ($BV_{ceo}$) for a single bipolar transistor. As clearly seen in FIG. 5, the breakdown voltage for this shallow emitter (wider base), represented by the curve labeled B, is substantially higher (6 to 7 volts) compared to the conventional bipolar transistor which has a breakdown voltage of about 4 to 5 volts.

Figure 6:
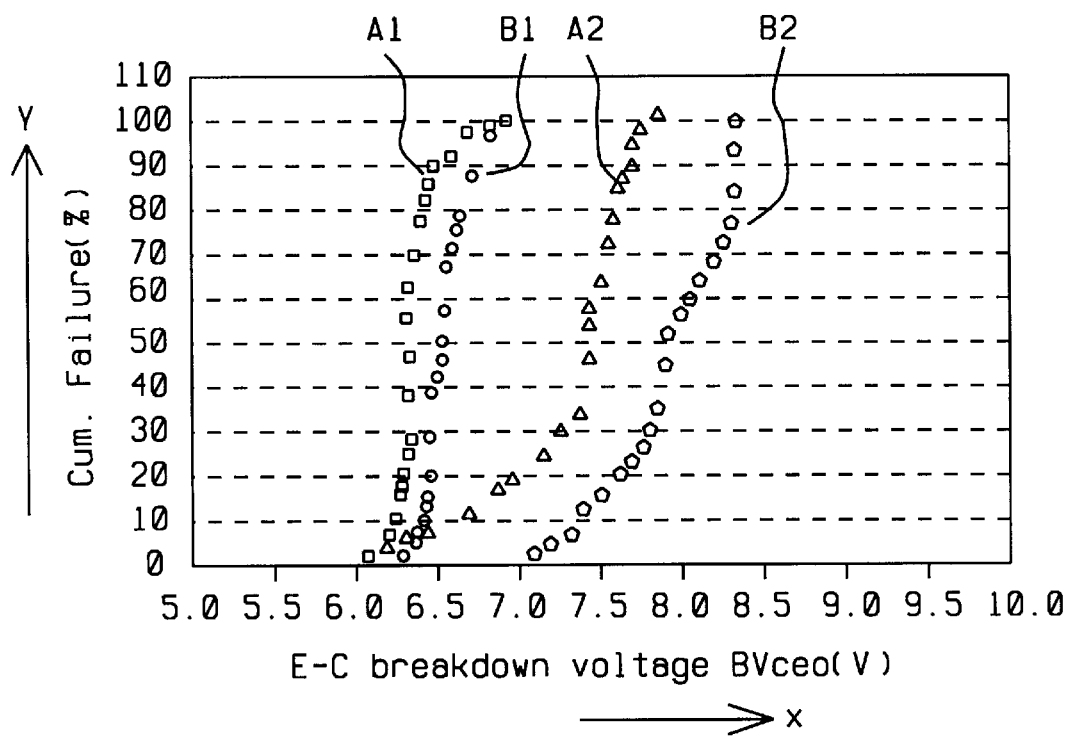
FIG. 6 shows a plot of the cumulative failure rate along the vertical axis (y axis) versus the emitter-collector breakdown voltage ($BV_{ceo}$) in volts along the horizontal axis (x axis) for two different emitter sizes and at two different deposition conditions, one using the conventional process, and the second using a temperature ramp process for the stacked emitter by the method of this invention.

FIG. 6 shows the cumulative failure rate (per cent) along the y axis versus the collector-to-emitter breakdown voltage along the x axis for both the conventional process and the shallow-emitter process of this invention. The curves A1 and A2 are for the conventional process and show the cumulative breakdown voltages for emitters having areas of 0.8×1.6 um² and 0.8×4.8 um², respectively. The curves B1 and B2 represent the cumulative breakdown voltages for the bipolar transistor having the shallow emitters of this invention using emitters having the same respective areas. FIG. 6 shows that the undoped amorphous silicon/doped polysilicon stacked emitters of this invention have higher breakdown voltages than emitters made by the conventional process, and that the breakdown voltage improves with increasing emitter size. The breakdown voltage ($BV_{ceo}$) is measured at a collector current ($I_c$) of 10 microAmperes (uA), and the cumulative plot is for a sample size of 5 sites on 21 wafers. Because of the shallower emitters, the junction capacitance is reduced resulting in increased cutoff frequency.

Referring back to the process flow in FIG. 1A, steps 18 and 19, the BiCMOS is completed using conventional processing to form the multilevels of metal interconnections and passivation. An insulating layer 48, such as borophosphosilicate glass, is deposited and openings 2 are etched to make contacts to the devices on the substrate. A first-level metal layer 50 is deposited and patterned to form the next level of metal interconnections, and the BiCMOS structure is shown completed up to the next level of insulation 52, as shown in FIGS. 1B and 3B. The patterned metal layers and insulating layers are then repeated to complete the multilevel of metal interconnections. The process is not described in detail, but generally includes depositing and patterning a first metal layer such as aluminum/copper and includes a barrier/adhesion layer such as titanium/titanium tungsten and the like. The insulating layers can also include a multilayer of plasma-enhanced silicon oxide/spin-on glass/plasma-enhanced silicon oxide to provide a more uniform surface for subsequent processing.

While the invention has been particularly shown and described with reference to the preferred embodiment thereof, it will be understood by those skilled in the art that various changes in form and details may be made without departing from the spirit and scope of the invention.

What is claimed is:

1. A method for making an emitter for a bipolar transistor on a BiCMOS circuit comprising the steps of:

providing a substrate having partially completed BiCMOS structures and having completed buried subcollectors with reachthrough contacts and diffused base regions over said subcollectors for said bipolar transistors and forming emitters by;

forming contact openings to said base regions;

forming a stacked layer by depositing an undoped amorphous silicon layer and a polysilicon layer on said substrate and over said openings in a continuous deposition process step;

doping said polysilicon layer;

patterning said stacked layer to form polysilicon emitters over said openings;

annealing said substrate to form shallow diffused emitter junctions in said substrate by diffusing the dopant in said polysilicon layer through said undoped amorphous silicon layer and into said substrate.

2. The method of claim 1, wherein said stacked layer is formed by chemical vapor deposition in a deposition chamber using silane ($SiH_4$) as the reactant gas.

3. The method of claim 1, wherein said stacked layer is formed by:

a) first depositing said amorphous silicon layer at a temperature not greater than 560° C. for a time sufficient to form a thickness of between about 300 and 600 Angstroms;

b) ramping the temperature up to at least 630° C. for a time sufficient to grow said polysilicon layer to a thickness of between about 2600 and 3400 Angstroms.

4. The method of claim 1, wherein said polysilicon layer over said amorphous silicon layer is doped with arsenic using an ion implant dose of between about 8.0 E 15 and 1.4 E 16 atoms/cm².

5. The method of claim 4, wherein said arsenic is ion implanted into said polysilicon layer at an energy sufficiently low to avoid implanting into said amorphous silicon layer.

6. The method of claim 1, wherein said annealing is a rapid thermal process at a temperature sufficiently high to drive in said dopant into said substrate.

7. The method of claim 6, wherein said rapid thermal process is carried out at a temperature of between about 950 and 1100° C. for a time of between about 10 and 60 seconds.

8. The method of claim 1, wherein said diffused emitter junctions have a metallurgical depth of between about 0.18 and 0.3 micrometers.

9. A method for making a bipolar transistor with a novel emitter for a BiCMOS circuit comprising the steps of:

providing a substrate having partially completed BiCMOS structures;

forming subcollectors in said substrate having reachthrough contacts;

forming base regions in said substrate over said subcollectors and forming said emitters by;

forming contact openings to said base regions;

forming a stacked layer by depositing an undoped amorphous silicon layer and a polysilicon layer on said substrate and over said openings in a continuous deposition process step;

doping said polysilicon layer;

patterning said stacked layer to form polysilicon emitters over said openings;

annealing said substrate to form shallow diffused emitter junctions in said substrate by diffusing the dopant in said polysilicon layer through said undoped amorphous silicon layer and into said substrate.

10. The method of claim 9, wherein said stacked layer is formed by chemical vapor deposition in a deposition chamber using $SiH_4$ as the reactant gas.

11. The method of claim 9, wherein said stacked layer is formed by:
   a) first depositing said amorphous silicon layer at a temperature not greater than 560° C. for a time sufficient to form a thickness of between about 300 and 600 Angstroms;
   b) ramping the temperature up to at least 630° C. for a time sufficient to grow said polysilicon layer to a thickness of between about 2600 and 3400 Angstroms.

12. The method of claim 1, wherein said polysilicon layer over said amorphous-silicon layer is doped with arsenic using an ion implant dose of between about 8.0 E 15 and 1.4 E 16 atoms/$cm^2$.

13. The method of claim 12, wherein said arsenic is ion implanted into said polysilicon layer at an energy sufficiently low to avoid implanting into said amorphous silicon layer.

14. The method of claim 9, wherein said annealing is a rapid thermal process at a temperature sufficiently high to drive in said dopant into said substrate.

15. The method of claim 14, wherein said rapid thermal process is carried out at a temperature of between about 950 and 1100° C. for a time of between about 10 and 60 seconds.

16. The method of claim 9, wherein said diffused emitter junctions have a metallurgical depth of between about 0.18 and 0.3 micrometers.

17. The method of claim 9, wherein said subcollectors and said emitters are doped with an N type dopant, and said base regions are doped with a P type dopant.

* * * * *